(12) United States Patent
Collins et al.

(10) Patent No.: US 6,874,573 B2
(45) Date of Patent: Apr. 5, 2005

(54) THERMAL INTERFACE MATERIAL

(75) Inventors: Andrew Collins, Bedford, NH (US);
Chih-Min Cheng, Westford, MA (US)

(73) Assignee: National Starch and Chemical Investment Holding Corporation, New Castle, DE (US)

(*) Notice: Subject to any disclaimer, the term of this patent is extended or adjusted under 35 U.S.C. 154(b) by 0 days.

(21) Appl. No.: 10/632,330

(22) Filed: Jul. 31, 2003

(65) Prior Publication Data

US 2005/0022971 A1 Feb. 3, 2005

(51) Int. Cl.$^7$ .................................................. F28F 7/00
(52) U.S. Cl. ....................................... 165/185; 165/905
(58) Field of Search ........................... 165/185, 905, 165/80.3, 133; 361/704, 708, 712; 525/183, 190, 192, 725

(56) References Cited

U.S. PATENT DOCUMENTS

| | | | |
|---|---|---|---|
| 4,576,845 A | 3/1986 | Krotchko | |
| 5,137,959 A | 8/1992 | Block et al. | |
| 5,545,473 A | 8/1996 | Ameen et al. | |
| 5,591,034 A | 1/1997 | Ameen et al. | |
| 5,738,936 A | 4/1998 | Hanrahan | |
| 5,783,465 A * | 7/1998 | Canning et al. | 438/119 |
| 5,807,910 A * | 9/1998 | Tseng et al. | 523/428 |
| 5,904,978 A | 5/1999 | Hanrahan et al. | |
| 5,945,217 A | 8/1999 | Hanrahan | |
| 6,054,198 A | 4/2000 | Bunyan et al. | |
| 6,063,839 A * | 5/2000 | Oosedo et al. | 523/206 |
| 6,090,484 A | 7/2000 | Bergerson | |
| 6,090,491 A | 7/2000 | Tan et al. | |
| 6,097,598 A | 8/2000 | Miyahara et al. | |
| 6,190,578 B1 * | 2/2001 | Yokoyama et al. | 252/512 |
| 6,203,873 B1 | 3/2001 | Shifman et al. | |
| 6,210,789 B1 | 4/2001 | Hanrahan | |
| 6,255,581 B1 | 7/2001 | Reis et al. | |
| 6,451,422 B1 | 9/2002 | Nguyen | |
| 6,464,672 B1 * | 10/2002 | Buckley | 604/304 |
| 2003/0039825 A1 | 2/2003 | Duvall et al. | |
| 2003/0089894 A1 | 5/2003 | Molnar et al. | |

FOREIGN PATENT DOCUMENTS

| | | |
|---|---|---|
| JP | 7145270 | 6/1995 |
| JP | 9324076 | 12/1997 |
| JP | 2001207143 | 7/2001 |

* cited by examiner

*Primary Examiner*—Tho Duong
(74) *Attorney, Agent, or Firm*—Charles W. Almer

(57) ABSTRACT

A composition for use as a thermal interface material in a heat-generating electronic device is provided. The composition comprises a blend of nitrile rubber and carboxyl-terminated butadiene, carboxyl-terminated butadiene nitrile or a mixture thereof, and conductive filler particles.

11 Claims, 1 Drawing Sheet

THERMAL INTERFACE MATERIAL

FIELD OF THE INVENTION

This invention relates to a thermally conductive material that is utilized to transfer heat from a heat-generating electronic device to a cold sink that absorbs and dissipates the transferred heat.

BACKGROUND OF THE INVENTION

Electronic devices, such as those containing semiconductors, typically generate a significant amount of heat during operation. In order to cool the semiconductors, cold sinks are typically affixed in some manner to the device. In operation, heat generated during use is transferred from the semiconductor to the cold sink where the heat is harmlessly dissipated. In order to maximize the heat transfer from the semiconductor to the cold sink, a thermally conductive thermal interface material is utilized. The thermal interface material ideally provides an intimate contact between the cold sink and the semiconductor to facilitate the heat transfer. Commonly, either a paste-like thermally conductive material, such as silicone grease, or a sheet-like thermally conductive material, such as silicone rubber is utilized as the thermal interface material.

Both the current paste-like and sheet-like thermally conductive materials have drawbacks that present obstacles during their use. For example, while some paste-like materials provide low thermal resistance, they must be applied in a liquid or semi-solid state and thus require manufacturing controls in order to optimize their application. In addition to enhanced controls during application, the handling of the paste-like materials can be difficult. Difficulties in utilizing existing materials include controls upon reapplication for pastes, migration of grease to unwanted areas, and reworkability for phase change materials or thermoset pastes. Traditional thermal interface films address the handling and application problems of pastes, however they typically have a higher thermal resistance as compared to pastes. Thus, it would be advantageous to provide a thermal interface material that is easy to handle and apply, yet also provides a low thermal resistance.

SUMMARY OF THE INVENTION

Figure 1:
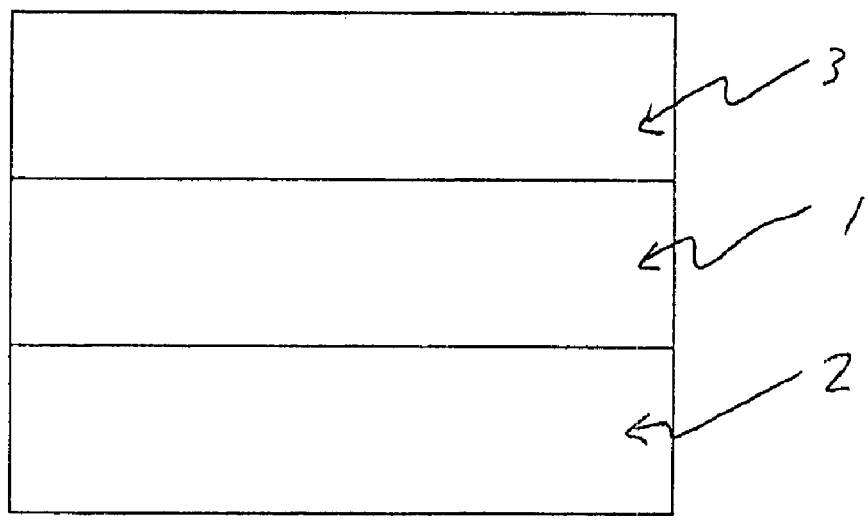
FIG. 1 is a side view of a heat-generating device, film and cold sink.

A composition for use as a thermal interface material in a heat-generating, semiconductor-containing device is provided. The composition comprises a blend of nitrile rubber and carboxyl-terminated butadiene, carboxyl-terminated butadiene nitrile or a mixture thereof, and thermally conductive particles.

Another aspect of the present invention provides an electronic device containing a heat-generating component, a cold sink and a thermal interface material according to the above description.

DETAILED DESCRIPTION OF THE PREFERRED EMBODIMENTS

The thermal interface material of the present invention may be utilized with virtually any heat-generating component for which it is desired to dissipate the heat. In particular, the thermal interface material is useful for aiding in the dissipation of heat from heat-generating components in semiconductor devices. In such devices, as shown in FIG. 1, the thermal interface material 1 forms a layer between the heat-generating component 2 and the cold sink 3 and transfers the heat to be dissipated to the cold sink.

The thermal interface material comprises a blend of nitrile rubber and carboxyl-terminated butadiene rubber ("CTB"), carboxyl-terminated butadiene nitrile rubber ("CTBN"), or a blend of CTB and CTBN, thermally conductive particles and other additives to increase the heat transport beyond the base rubber formulation. Depending upon the composition it may be desirable to form the films via hot melt extrusion. Preferably the material is blended such that the rubber components retain their flexibility at high particle loading and so that the material retains its properties under accelerated stress testing.

The rubber components of the composition are not utilized as impact modifiers, as rubbers are commonly utilized, but instead as film forming compositions. The rubbers are compatible with polar chemistries and have a good affinity for the substrate and fillers. In traditional rubber compositions, the rubber polymers are vulcanized by peroxide or sulfide curing agents. In the composition described herein, the rubbers are not cured and their film forming and wetting properties are tailored by proper selection of the base polymers.

The nitrile rubber provides a high molecular weight film-forming component to the composition. The nitrile rubber provides the advantageous properties of good handling and flexibility to the composition. Nitrile rubber and CTBN are similar in chemistry, however in nitrile rubber the carboxy functionality is incorporated along the backbone of the molecule while in CTBN the carboxy functionality is at the end of the molecule. The differences between the two produce different reaction kinetics with the nitrile rubber providing superior strength to the composition.

The CTB component is a liquid modifier and the low viscosity component in the composition. The Brookfield viscosity as indicated on the TDS is 60,000 cps @ 27° C. For example, the Nipol 1072x28 material is defined by Mooney Viscosity and that value is between 35 and 55 while 1072CG has a Mooney viscosity of between 22 and 35 (ASTMD1646, 100° C., ML (1+4)). As the thermal interface material is thermoplastic, the flow of the liquid modifier is critical to good performance. The low viscosity component of the blend provides the property of good surface wetting under heat and/or pressure to the material. As the low viscosity component is conformable under heat and/or pressure, the thermal interface material will be similar in performance to a phase change material. Preferably, the low viscosity component will allow the thermal interface material to have a wetting capability similar to that of a liquid. However, unlike a phase change or liquid material, the thermal interface material retains its physical integrity until the upper use temperature.

The CTBN component is a high viscosity component that allows for a film format, as the low viscosity CTB modifier is not a film forming resin due to its low viscosity. When utilized in a blend with CTB, the compatibility between CTB and CTBN is very good due to the similarities in their chemistries. CTBN is commercially available in liquid or semi-solid formats depending upon the molecular weight and acrylonitrile content.

The combination of the high and low viscosity rubbers will produce a material having sufficient integrity to be a solid at room temperature and properties of a low viscosity material. Thus, the resulting material will be suitable for use as a tape or film and will provide good surface wetting. The material is capable of wetting substrates with high surface energy, such as metals, and low surface energy, such as plastics. Further, due to the combination of the two rubbers the resulting material is reworkable and can be easily removed from a substrate after application without the use of solvent or heat. This property is unique as compared to other thermal interface materials that offer low thermal resistance. The thermal interface materials of the present invention are also unique in that they provide a thin film with low thermal resistance. In contrast, grease thermal interface materials provide low thermal resistance, but require dispensing or screen/stencil printing. A further benefit of the thermal interface materials of the present invention is that they are reworkable without heat or solvents, thus allowing reworking in any location. Typically, the use of this material would require external support, such as clamping. Finally, in the form of a film the thermal interface material of the present invention will not flow to any unwanted areas of the substrate to which it is being applied. In addition, a pressure sensitive adhesive may be applied to the film in order to provide sufficient tack to hold the film in position during application. If desired, the material may also be in the form of a paste.

The thermal interface materials may be cured with numerous known materials, including peroxides and amines. Methods of curing include press cure and autoclave cure. A wide range of cure conditions are possible, depending upon the time, temperature and pressure applied during cure. Other components that affect the cure schedule are polymer blend, cure system, acid acceptor, filler system and part configuration.

In addition to the rubber blend, the thermal interface material further comprises thermally conductive particles. These particles may be either electrically conductive or non conductive. The material preferably comprises in the range of about 20 to about 95 wt % conductive particles and most preferably in the range of about 50 to about 95 wt % conductive particles. The conductive particles may comprise any suitable thermally conductive material, including silver, gold, nickel, copper, metal oxides, boron nitride, alumina, magnesium oxides, zinc oxide, aluminum, aluminum oxide, aluminum nitride, silver-coated organic particles, silver plated nickel, silver plated copper, silver plated aluminum, silver plated glass, silver flakes, carbon black, graphite, boron-nitride coated particles and mixtures thereof. Preferably, the conductive particles are boron nitride.

The thermal interface material of the invention preferably comprises between about 10–85 volume % nitrite rubber, between about 2 to about 80 volume % of a CTB and/or about 2 to about 80 volume % of a CTBN. The thermal interface material of the invention most preferably comprises between about 25–50 volume % of the nitrite rubber, between about 5–30 volume % of a CTB and/or between about 5–30 volume % of a CTBN. The material preferably comprises in the range of about 20 to about 95 weight % conductive particles.

In addition to the conductive particles, additives may be included in the formulation to provide desired properties. One of the most advantageous properties provided by additives is improved handling. In particular, materials that are solid at room temperature, such as phenol formaldehyde, phenolics, waxes, epoxy, thermoplastics and acrylics are advantageous for providing improved handling. Various additives that may be included are surface active agents, surfactants, diluents, wetting agents, antioxidants, thixotropes, reinforcement materials, silane functional perfluoroether, phosphate functional perfluoroether, silanes, titanates, wax, phenol formaldehyde, epoxy and other low molecular weight polymers that offer surface affinity and polymer compatibility.

The invention is further illustrated by the following non-limiting example:

EXAMPLE 1

Six thermal interface materials and a control material were formulated as shown Table 1 (all percents are in weight percent). The nitrile rubber was dissolved at 20% solids in methyl ethyl ketone. Next, the ingredients were added stepwise into a mixing vessel. The mix vessel was placed under an air driven mixer and the materials were mixed for 20 minutes. Next, the materials were de-gassed and coated at 5 ft/min onto a silicone treated carrier substrate. Following the coating of the material, the film is dried at 75° C. for 20 minutes to remove solvent.

TABLE 1

Thermal Interface Formulations

| Formulation | A | B | C | D | E |
|---|---|---|---|---|---|
| Nitrile rubber[1] | 9.0 | 8.2 | 6.3 | 4.5 | 6.3 |
| CTB[2] | | | 2.7 | 4.5 | |
| CTBN[3] | | | | | 2.7 |
| S10[4] | | 0.2 | | | |
| F10[5] | | 0.6 | | | |
| Ag | 91.0 | 91.0 | 91.0 | 91.0 | 91.0 |

[1]Nitrile rubber: Nipol 1072CG commercialized by Zeon Chemical
[2]CTB: Hycar 2000x162, carboxyl-terminated butadiene polymer commercialized by Noveon
[3]CTBN: Hycar 1300x13 carboxyl-terminated butadiene acrylonitrile copolymer commercialized by Noveon
[4]S10: Silane functional perfluoroether commercialized by Ausimont
[5]F10: Phosphate functional perfluoroether commercialized by Ausimont The formulations of Table 1 were tested via steady state thermal analysis and the results of the testing are set out in Table 2.

TABLE 2

Results of Thermal Interface Formulations

| Formulation | A | B | C | D | E |
|---|---|---|---|---|---|
| Thickness, mil | 3.6 | 4.1 | 3.5 | 3.6 | 3.8 |
| Resistance, mm$^2$K/W | | | | | |
| run1 | 28 | 24 | 22 | 28 | 27 |
| run2 | 26 | 24 | 21 | 26 | 26 |
| Rework | Good | Good | Good | Good | Good |

EXAMPLE 2

To improve the film handling properties of the thermal interface material, reinforcing organic additives may be used. Table 3 illustrates several example formulations that exhibit improved handling and excellent thermal performance. The materials described in Table 3 were coated with the same procedure as Example 1.

TABLE 3

Thermal Interface Formulations

| Formulation | F | G | H | I | J | K | L |
|---|---|---|---|---|---|---|---|
| Nitrile rubber[1] | 22.0 | 20.1 | 20.1 | 18.3 | 18.3 | 20.1 | 9.1 |
| CTB | 9.4 | 8.6 | 8.6 | 7.9 | 7.9 | 8.6 | 3.9 |
| S10 | 0.8 | 0.7 | 0.7 | 0.7 | 0.7 | 0.7 | 0.3 |
| F10 | 0.8 | 0.7 | 0.7 | 0.7 | 0.7 | 0.7 | 0.3 |
| SP25[2] | | 3.0 | | | | 2.75 | |
| 7006[3] | | | 3.0 | 5.5 | | 2.75 | |
| 1001F[4] | | | | | | 3.0 | 1.4 |
| BN[5] | 67.0 | 67.0 | 67.0 | 67.0 | 67.0 | 67.0 | |
| Alumina | | | | | | | 85.0 |

[1]Nitrile rubber: Nipol 1072, commercialized by Zeon Chemical
[2]SP25: Phenol formaldehyde commercialized by Schenectady International
[3]7006: Fluorolink wax commercialized by Ausimont
[4]1001F: Solid epoxy resin commercialized by Resolution Performance
[5]BN: Boron nitride filler commercialized by Carborundum The formulations of Table 3 were tested via the laser flash method and the results of that testing are shown in Table 4.

TABLE 4

Results of Thermal Interface Formulations

| Formulation | F | G | H | I | J | K | L |
|---|---|---|---|---|---|---|---|
| Thickness, mil | 4.5 | 3 | 4.5 | 4.5 | 4.5 | 10 | 4.5 |
| Resistance, mm$^2$K/W | 15 | 23 | 27 | 30 | 34 | 27 | 43 |
| Rework | Good | Good | Good | Good | Good | Good | Good |
| Handling | Fair | Fair | Good | Good | Good | Good | Good |

As shown in Table 4, the formulations containing solid additives provide improved handling properties.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. A thermally conductive composition for transferring heat from a heat generating component to a cold sink, comprising nitrile rubber, thermally conductive particles and one or more of the group consisting of uncured carboxyl-terminated butadiene, carboxyl-terminated butadiene nitrile and mixtures thereof.

2. The composition of claim 1, wherein the composition is formed via hot melt extrusion.

3. The composition of claim 1, wherein the composition comprises in the range of about 5 volume % to about 30 volume % of the carboxyl-terminated butadiene.

4. The composition of claim 1, wherein the composition comprises in the range of about 5 volume % to about 30 volume % of the carboxyl-terminated butadiene nitrile.

5. The composition of claim 1, wherein the composition comprises in the range of about 20 volume % to about 85 volume % of the nitrile rubber.

6. The composition of claim 1, wherein the conductive particles comprise silver, gold, nickel, copper, metal oxides, boron nitride, alumina, magnesium oxides, zinc oxide, aluminum, aluminum oxide, aluminum nitride, silver-coated organic particles, silver plated nickel, silver plated copper, silver plated aluminum, silver plated glass, silver flakes, carbon black, graphite, boron nitride-coated particles and mixtures thereof.

7. The composition of claim 6, wherein the composition comprises in the range of about 25 volume % to about 50 volume % of the nitrile rubber.

8. The composition of claim 1, further comprising one or more additives.

9. The composition of claim 8, wherein the thermally conductive composition comprises in the range of about 20 wt % to about 95 wt % conductive particles.

10. The composition of claim 8, wherein the additives are selected from the group consisting of surface active agents, antioxidants, surfactants, diluents, wetting agents, thixotropes, reinforcement materials, silane functional perfluoroether, phosphate functional perfluoroether, silanes, titanates, wax, phenol formaldehyde, epoxy, acrylic, low molecular weight polymers that offer surface affinity and polymer compatibility, and mixtures thereof.

11. The composition of claim 1, wherein the composition is in the form of a paste, supported or free-standing film.

* * * * *